(12) United States Patent
Chen et al.

(10) Patent No.: US 12,344,113 B2
(45) Date of Patent: Jul. 1, 2025

(54) CHARGING PILE AND TESTING DEVICE, SYSTEM AND METHOD THEREOF

(71) Applicant: Sungrow Power Supply Co., Ltd., Hefei (CN)

(72) Inventors: Hongchuang Chen, Hefei (CN); Luguo Wang, Hefei (CN); Zengfu Ding, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 677 days.

(21) Appl. No.: 17/708,292

(22) Filed: Mar. 30, 2022

(65) Prior Publication Data

US 2022/0340032 A1     Oct. 27, 2022

(30) Foreign Application Priority Data

Apr. 21, 2021 (CN) .......................... 202110430328.7

(51) Int. Cl.
*B60L 53/60* (2019.01)
*B60L 53/16* (2019.01)
*B60L 53/30* (2019.01)
*B60L 53/34* (2019.01)
*G01R 31/28* (2006.01)

(52) U.S. Cl.
CPC .............. *B60L 53/60* (2019.02); *B60L 53/16* (2019.02); *B60L 53/305* (2019.02); *B60L 53/34* (2019.02); *G01R 31/2813* (2013.01)

(58) Field of Classification Search
CPC ....................................................... B60L 53/60
USPC ....................................................... 320/109
See application file for complete search history.

(56) References Cited

U.S. PATENT DOCUMENTS

| 2012/0022811 A1* | 1/2012 | Dickinson | B60L 53/18 |
| | | | 235/382 |
| 2013/0346010 A1* | 12/2013 | Schulz | B60L 53/14 |
| | | | 324/602 |
| 2013/0346025 A1* | 12/2013 | Schulz | B60L 53/60 |
| | | | 702/182 |

(Continued)

FOREIGN PATENT DOCUMENTS

| CN | 202886486 U | 4/2013 |
| CN | 204832381 U | 12/2015 |

(Continued)

OTHER PUBLICATIONS

EP22162227.7, Sep. 9, 2022, Extended European Search Report.

(Continued)

*Primary Examiner* — Jerry D Robbins

(57) ABSTRACT

A charging pile, and a device, system and method for testing a charging pile are provided. An inner side of a port of one of the gun bases is connected to an inner side of the same port of the other of the gun bases. An outer side of each port of each gun base connected to a port of a charging gun connected to the gun base, so that the two charging guns are connected. In addition, one of the two charging guns operates in the forward output state and serves as tested gun to be tested. The other of the two charging guns operates in the reverse conversion state and serves as a testing gun to test the tested gun. The gun base controller saves and exports the communication data on the communication bus between the two charging guns.

20 Claims, 5 Drawing Sheets

(56) References Cited

U.S. PATENT DOCUMENTS

| | | | | |
|---|---|---|---|---|
| 2015/0112541 | A1* | 4/2015 | Kakinuma | G07C 5/008 701/31.5 |
| 2016/0327615 | A1* | 11/2016 | Wallace | G01R 31/52 |
| 2019/0232813 | A1* | 8/2019 | Kusumi | B60L 53/305 |

FOREIGN PATENT DOCUMENTS

| | | |
|---|---|---|
| CN | 205246841 U | 5/2016 |
| CN | 205809192 U | 12/2016 |
| CN | 205812043 U | 12/2016 |
| CN | 106864300 A | 6/2017 |
| CN | 107290610 A | 10/2017 |
| CN | 107422219 A | 12/2017 |
| CN | 207490560 U | 6/2018 |
| CN | 109342972 A | 2/2019 |
| CN | 109581097 A | 4/2019 |
| CN | 109683035 A | 4/2019 |
| CN | 110191012 A | 8/2019 |
| CN | 209627389 U | 11/2019 |
| CN | 210665913 U | 6/2020 |
| CN | 111722044 A | 9/2020 |
| CN | 111762050 A | 10/2020 |
| CN | 111856304 A | 10/2020 |
| CN | 211785826 U | 10/2020 |
| CN | 212872688 U | 4/2021 |
| JP | H03-61875 A | 3/1991 |
| WO | WO 2020/181656 A1 | 9/2020 |

OTHER PUBLICATIONS

CN202110430328.7, Mar. 21, 2022, First Office Action.

First Office Action for Chinese Application No. 202110430328.7, dated Mar. 21, 2022.

Chen et al., Research on Remote Calibration System of DC Metering Device for Electric Vehicle Charging Piles Based on Embedded. 2019 IEEE 3rd Information Technology, Networking, Electronic and Automation Control Conference (ITNEC). Mar. 15, 2019:300-4.

Li et al., Design of Simulation Test Platform for Charging Pile Control System. Journal of Physics: Conference Series. May 1, 2020;1550(6):062004.

Yang et al., The Research And Application of Electrombile Charging Facilities Integration Test Terrace. Hebei Electric Power. Jun. 2018;37(3):23-5.

Zhou et al., An FPGA based modular system for electric vehicle charging pile field testing. 2018 IEEE Vehicle Power and Propulsion Conference (VPPC). Aug. 27, 2018:1-5.

Extended European Search Report for European Application No. 22162227.7, dated Sep. 9, 2022.

* cited by examiner

CHARGING PILE AND TESTING DEVICE, SYSTEM AND METHOD THEREOF

The present disclosure claims the priority to Chinese Patent Application No. 202110430328.7, titled "CHARGING PILE AND TESTING DEVICE, SYSTEM AND METHOD THEREOF", filed on Apr. 21, 2021, with the China National Intellectual Property Administration, the content of which is incorporated herein by reference.

FIELD

The present disclosure relates to the technical field of charging pile, and in particular to a charging pile, a device for testing a charging pile, a system for testing a charging pile, and a method for testing a charging pile.

BACKGROUND

With the widespread use of electric vehicles, the construction and maintenance of charging facilities for the electric vehicles are gradually improved. In order to ensure the safety of the charging process and discover the problems of the charging piles in time, it is required to check the charging piles frequently.

However, for the conventional charging pile, an external testing device and load device are required in performing on-site inspection or maintenance on the charging pile, resulting in that the on-site maintenance is inconvenient and cumbersome. In addition, electric energy is wasted in performing on-site maintenance and testing.

SUMMARY

Based on the above disadvantages of the conventional technology, a charging pile, and a device, system, and method for testing a charging pile are provided according to the present disclosure to improve operation convenience and reduce energy loss.

In order to achieve the above objectives, the following technical solutions are provided according to the embodiments of the present disclosure.

A device for testing a charging pile is provided according to a first aspect of the present disclosure. The device includes a first gun base, a second gun base and a gun base controller. The first gun base is provided with a power port and a communication port. The second gun base is provided with a power port and a communication port. An inner side of the power port of the first gun base is connected to an inner side of the power port of the second gun base, and an inner side of the communication port of the first gun base is connected to an inner side of the communication port of the second gun base. An outer side of the power port of the first gun base is connected to a corresponding port of a charging gun connected to the first gun base, and an outer side of the communication port of the first gun base is connected to a corresponding port of the charging gun connected to the first gun base. An outer side of the power port of the second gun base is connected to a corresponding port of a charging gun connected to the second gun base, and an outer side of the communication port of the second gun base is connected to a corresponding port of the charging gun connected to the second gun base. One of the charging gun connected to the first gun base and the charging gun connected to the second gun base serves as a tested gun operating in a forward output state, and the other one of the charging gun connected to the first gun base and the charging gun connected to the second gun base serves as a testing gun operating in a reverse conversion state. An inner connection line of the communication port of the first gun base is connected to an inner communication terminal of the gun base controller via a communication bus, and an inner connection line of the communication port of the second gun base is connected to an inner communication terminal of the gun base controller via the communication bus. The gun base controller is configured to save communication data on the communication bus and export the communication data via an outer communication terminal of the gun base controller.

In an embodiment, the power port includes a charging power port and an auxiliary power port. The first gun base is further provided with a protection line port. The second gun base is further provided with a protection line port. An inner side of the charging power port of the first gun base is connected to an inner side of the charging power port of the second gun base, and an outer side of the charging power port of the first gun base is connected to a corresponding port of the charging gun connected to the first gun base. An inner side of the auxiliary power port of the first gun base is connected to an inner side of the auxiliary power port of the second gun base, and an outer side of the auxiliary power port of the first gun base is connected to a corresponding port of the charging gun connected to the first gun base. An inner side of the protection line port of the first gun base is connected to an inner side of the protection line port of the second gun base, and an outer side of the protection line port of the first gun base is connected to a corresponding port of the charging gun connected to the first gun base.

In an embodiment, the first gun base is further provided with a first connection confirmation port and a second connection confirmation port, and the second gun base is further provided with a first connection confirmation port and a second connection confirmation port. For the first gun base, an inner side of the first connection confirmation port is connected to an inner connection line of the protection line port via a resistor and a to switch in the gun base controller, an outer side of the first connection confirmation port is connected to a corresponding port of the charging gun, and an outer side of the second connection confirmation port is connected to a corresponding port of the charging gun. For the second gun base, an inner side of the first connection confirmation port is connected to an inner connection line of the protection line port via a resistor and a switch in the gun base controller, an outer side of the first connection confirmation port is connected to a corresponding port of the charging gun, and an outer side of the second connection confirmation port is connected to a corresponding port of the charging gun. The gun base controller is further configured to: determine whether the first gun base is inserted with the charging gun by detecting a resistance between the second connection confirmation port and the protection line port of the first gun base; determine whether the second gun base is inserted with the charging gun by detecting a resistance between the second connection confirmation port and the protection line port of the second gun base; and in a case that the first gun bases is inserted with the charging gun and the second gun base is inserted with the charging gun, control a switch to be turned on to inform the two charging guns that the two charging guns are respectively connected.

In an embodiment, for the first gun base, an inner connection line of the auxiliary power port is connected to a power terminal of the gun base controller to supply power to the gun seat controller, and the protection line port is connected to a grounding terminal of the gun base controller; and for the second gun base, an inner connection line of the auxiliary power port is connected to the power terminal of the gun base controller to supply power to the gun seat controller; and the protection line port is connected to the grounding terminal of the gun base controller.

In an embodiment, the communication data is a CAN message transmitted between the tested gun and the testing gun.

A charging pile is further provided according to a second aspect of the present disclosure. The charging pile includes one or more charging branches. Each of the charging branches includes a power conversion unit, a control unit and a charging gun. A first terminal of the power conversion unit is connected to a power grid via a device. A second terminal of the power conversion unit is connected to an inner side of the charging gun via the control unit. An outer side of the charging gun is connected to the device for testing a charging pile according to the first aspect of the present disclosure. At least one of the charging branches is a bidirectional transmission branch. The power conversion unit in the charging branch has a function of bidirectional power conversion, and an operation state of the power conversion unit includes a forward output state and a reverse conversion state. The control unit is configured to: in a case that the power conversion unit operates in the forward output state, control the charging gun to provide a charging function and serve as a tested gun; and in a case that the power conversion unit operates in the reverse conversion state, control the charging gun to provide a function of transmitting a communication message and serve as the testing gun.

In an embodiment, the charging pile further includes a switching unit arranged between the charging branches and the power grid.

In an embodiment, the power conversion unit includes an AC/DC conversion unit and a DC/DC unit. An alternating current side of the AC/DC conversion unit serves as the first terminal of the power conversion unit and is connected to the power grid via the switching unit. A direct current side of the AC/DC conversion unit is connected to the control unit via the DC/DC unit.

In an embodiment, in a case that the charging pile includes multiple charging branches, the multiple charging branches share the same switching unit.

In an embodiment, in a case that the charging pile includes multiple charging branches, the charging pile further includes AC/DC conversion units. For each of the multiple charging branches, the power conversion unit in the charging branch is a DC/DC unit, and the first terminal of the power conversion unit is connected to a direct current side of one of the AC/DC conversion unit via a direct current bus. An alternating current side of the AC/DC conversion unit is connected to the power grid via the switching unit.

In an embodiment, a sum of rated powers of all DC/DC units is greater than a sum of rated powers of all AC/DC conversion units.

In an embodiment, the communication message includes a simulated vehicle end BMS message, and the simulated vehicle end BMS message meets a predetermined standard.

In an embodiment, in a case that the charging pile includes the multiple charging branches, at least one of the charging branches is a unidirectional transmission branch, the power conversion unit in the charging branch does not have a function of bidirectional power conversion, and the operation state of the power conversion unit only includes the forward output state.

A system for testing a charging pile is further provided according to a third aspect of the present disclosure. The system includes two charging branches and one device for testing a charging pile according to the first aspect of the present disclosure. One of the two charging branches includes a charging gun serving as a tested gun, and the other one of the two charging branches includes a charging gun serving as a testing gun. The charging branch including the testing gun is a bidirectional transmission branch in the charging pile according to the second aspect of the present disclosure.

In an embodiment, the charging branch including the tested gun is the bidirectional transmission branch in the charging pile according to the second aspect of the present disclosure.

In an embodiment, the tested gun and the testing gun are included in one charging pile or different charging piles.

A method for testing a charging pile is further provided according to a fourth aspect of the present disclosure. The method is applied to the system for testing a charging pile according to the third aspect of the present disclosure. The method includes: determining, by each of two charging branches in the testing system, an operation mode of the charging branch to determine whether that a charging gun in the charging branch serves as the tested gun or the testing gun; determining, by the gun base controller in a testing device of the testing system, Whether each of two charging guns in the testing device is inserted with a charging gun; informing, by the gun base controller in a case that each of the two gun bases in the testing device is inserted with the charging gun, the two charging guns that the two charging guns are respectively connected with the two charging branches; establishing a communication between the two charging branches and starting testing; and saving, by the gun base controller, communication data on a communication bus in the testing device in real time.

In an embodiment, the determining, by each of two charging branches in the testing system, an operation mode of the charging branch to determine that a charging gun in the charging branch serves as a tested gun or a testing gun includes: determining, by one of the charging branches based on operation mode setting information received by the charging to branch, that it is required to control a power conversion unit in the charging branch to operate in a forward output state, wherein a charging gun in the charging branch provides a charging function and serves as the tested gun; and determining, by the other one of the charging branches based on the operation mode setting information received by the charging branch, that it is required to control a power conversion unit in the charging branch to operate in a reverse conversion state, wherein a charging gun in the charging branch provides a function of transmitting a simulated vehicle end BMS message and serves as the testing gun.

In an embodiment, the establishing communication between the two charging branches and starting testing includes: transmitting, by the tested gun, a first handshake message; transmitting, by the testing gun after receiving the first handshake message, a second handshake message; adjusting, by a power conversion unit in the charging branch including the tested gun, an operation state of the power conversion unit to a forward output state; and adjusting, by the power conversion unit in the charging branch including the testing gun, an operation state of the power conversion unit to a reverse conversion state.

In an embodiment, after the saving, by the gun base controller, communication data on a communication bus in the testing device in real time, the method further includes: exporting, by the gun base controller, the communication data.

In the device for testing a charging pile according to the present disclosure, each of the two gun bases is provided with: a charging power port, a communication port, an auxiliary power port and a protection line port. An inner side of each of the above four ports of one of the two gun bases is connected to an inner side of the same port of the other of the two gun bases, and an outer side of each of the above four ports of one of the two gun bases is connected to a corresponding port of a charging gun connected to the gun base, thereby realizing a connection between two charging guns. One of the two charging guns operates in the forward output state and serves as a tested gun to be tested. The other of the two charging guns operates in the reverse conversion state and serves as a testing gun to test the tested gun. The gun base controller saves and exports the communication data on the communication bus between the two charging guns, performing testing on the tested gun without the external device in the conventional technology, and thereby improving the convenience of the testing operation. In addition, the testing gun performs reverse conversion on the direct current charging electric energy received by the testing gun, and then the electric energy is fed back to the energy source of the charging gun, reducing the energy loss in the testing according to the conventional technology.

BRIEF DESCRIPTION OF THE DRAWINGS

In order to more clearly describe the technical solutions in the embodiments of the present disclosure or in the conventional technology, the drawings used in the embodiments or the description of the conventional technology are briefly described below. It is apparent that the drawings described below show merely some embodiments of the present disclosure, and those skilled in the art may obtain other drawings according to the drawings without any creative effort.

DETAILED DESCRIPTION OF EMBODIMENTS

The technical solutions in the embodiments of the present disclosure are clearly and completely described below in conjunction with the drawings in the embodiments of the present disclosure. Apparently, the embodiments described below are only some embodiments of the present disclosure, rather than all the embodiments. Based on the embodiments of the present disclosure, all other embodiments obtained by those skilled in the art without any creative effort fall within the protection scope of the present disclosure.

In this specification, terms of "include", "comprise" or any other variants are intended to be non-exclusive. Therefore, a process, a method, an article or a device including a series of elements includes not only the elements but also other elements that are not enumerated, or also include the elements inherent for the process, the method, the article or the device. Unless expressively limited otherwise, the statement "comprising (including) one . . . " does not exclude the case that other similar elements may exist in the process, the method, the article or the device.

A device for testing a charging pile is provided according to the present disclosure to improve the convenience of operation and reduce the energy loss.

Figure 1:
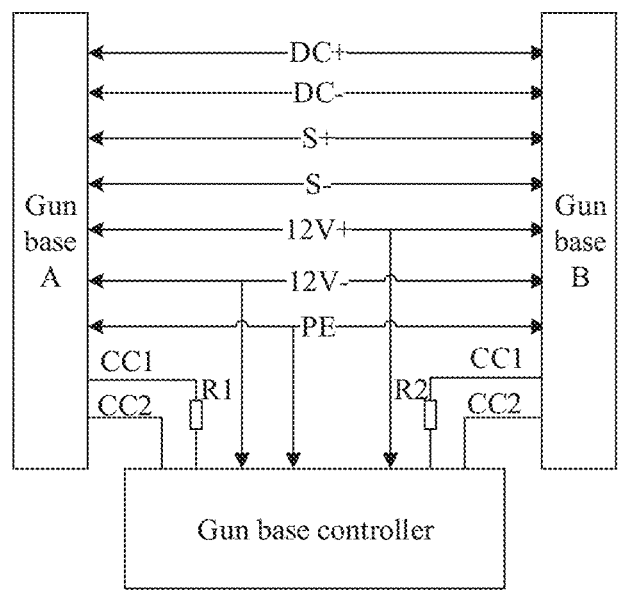
FIG. 1 is a schematic structural diagram of a device for testing a charging pile according to an embodiment of the present disclosure.

Referring to FIG. 1, the device for testing a charging pile includes a first gun base (the gun base A shown in FIG. 1), a second gun base (the gun base B shown in FIG. 1) and a gun base controller.

Each of the first gun base and the second gun base is provided with a power port and a communication port. In practical application, the power port includes a charging power port and an auxiliary power port. In addition, each of the first gun base and the second gun base is further provided with a protection line port.

It should be noted that names of the ports are not shown in FIG. 1. Each of the ports of the gun bases includes an inner side and an outer side. An inner side of a port is used for an internal connection of the device, and an outer side of the port is used for an external connection of the device.

An inner side of a port of a gun base is connected to an inner side of a corresponding port of another gun base. As shown in FIG. 1, positive poles of the charging power ports are connected by using a DC+ cable, and negative poles of the charging power ports are connected by using a DC− cable; positive poles of the communication ports are connected by using an S+ cable, and negative poles of the communication ports are connected by using an S− cable; positive poles of the auxiliary power ports are connected by using a 12V+ cable, and negative poles of the auxiliary power ports are connected by using a 12V− cable; and protection line ports are connected by using a PE cable. It should be noted that the voltage at the auxiliary power port is not limited to 12V, and FIG. 1 only shows an example. In practical application, the voltage at the auxiliary power port may be equal to 24V or other values, which are within the protection scope of the present disclosure.

For each of the two gun bases, an outer side of a port of the gun base is connected to a corresponding port of a charging gun connected to the gun base, thereby realizing connection of two charging guns. The charging gun connected to one of the two gun bases serves as a tested gun in a forward output state, and the charging gun connected to the other one of the two gun bases serves as a testing gun in a reverse conversion state. That is, one of the two charging guns connected to the device takes power from the power grid, outputs direct current charging electric energy, and is to be tested; and the other one of the two charging guns simulates a BMS system, receives the direct current charging electric energy, performs reverse conversion, and then feeds back the electric energy to the power grid or a shared direct current bus to perform testing. For the charging gun serving as the testing gun, it is required for a front-end power conversion unit of the charging gun to have a function of bidirectional power conversion and operate in a forward output state or a reverse conversion state. For the charging gun serving as the tested gun, in one case, the front-end power conversion unit of the charging gun may be a conventional power conversion unit and only operates in the forward output state; in another case, the front-end power conversion unit of the charging gun may have the function of bidirectional power conversion, that is, the charging gun currently serving as the tested gun may serve as a testing gun in a next test. The configurations of the power conversion unit of the charging gun serving as the tested gun in the above two cases, may be determined according to the application environment, and fall within the protection scope of the present disclosure.

In practical application, in a case that it is required to perform on-site inspection on the charging pile, the two charging guns may be connected by using the device. Parameter configuration or automatic switching is performed to control each of the two charging guns to operate in a certain mode and to control each of front-end devices in the two charging guns to operate in a certain state. Therefore, one of the two charging guns outputs normally and serves as a tested gun, and the other of the two charging guns simulates the BMS system and serves as a testing gun.

In addition, an inner connection line of each of the communication ports is connected to an inner communication terminal of the gun base controller via a communication bus, so that the gun base controller may save communication data on the communication bus and export the communication data via an outer communication terminal of the gun base controller. The communication data is a CAN message transmitted between the tested gun and the testing gun, such as a simulated vehicle end BMS message transmitted by the testing gun and a response message transmitted by the tested gun.

In practical application, the gun base controller may receive and save a CAN message between S+ and S− in real time and may export the CAN message via a medium for data analysis by staff.

In the device for testing a charging pile according to the embodiments of the present disclosure, one of the two gun bases is connected to the charging gun serving as the tested gun, and the other one of the two gun bases is connected to the charging gun serving as the testing gun. On-site inspection is performed on the charging guns based on a CAN communication connection and message transmission and reception. In a case that the charging pile includes multiple charging guns, inspection is performed on all the charging guns to perform testing on the charging pile. During the testing process, the tested gun and the testing gun are connected by using the device without the external device according to the conventional technology, meeting the requirements of the on-site inspection, solving the problem of taking bulky protocol testing device in performing on-site inspection on a charging pile, reducing the difficulty of on-site maintenance and overhaul of the charging pile, and thereby improving convenience of testing operation. Moreover, bidirectional flow of energy can be realized by the testing gun, so that the testing gun performs reverse conversion on the direct current charging electric energy received by the testing gun, and then the electric energy is fed back to the energy source of the charging gun, reducing the energy loss in the testing according to the conventional technology.

In an embodiment, referring to FIG. 1, each of the first gun base and the second gun base is further provided with a first connection confirmation port CC1 and a second connection confirmation port CC2.

For one of the gun bases, an inner side of the first connection confirmation port CC1 is connected to an inner connection line PE of the protection line port via a resistor (R1 or R2 as shown in FIG. 1) and a switch (not shown in FIG. 1) in the gun base controller; and an outer side of the first connection confirmation port CC1 is connected to a corresponding port of a charging gun corresponding to the gun base, and an outer side of the second connection confirmation port CC2 is connected to a corresponding port of the charging gun. The first gun base and the second gun base do not include a resistor connected with CC1 and PE. The resistor R1 is connected with CC1 of the first gun base and PE, and the resistor R2 is connected with CC1 of the second gun base and PE. The resistances of the resistors R1 and R2 may be, but is not limited to, 1KΩ. Switches are integrated in the gun base controller to control R1 to be connected between the CC1 of the first gun base and the PE and control R2 to be connected between the CC1 of the second gun base and the PE.

The gun base controller is further configured to: determine whether the first gun base is inserted with the charging gun by detecting a resistance between the second connection confirmation port CC2 and the protection line port of the first gun base; determine whether the second gun base is inserted with the charging gun by detecting a resistance between the second connection confirmation port CC2 and the protection line port of the second gun base; and control, in a case that the first gun bases is inserted with the charging gun and the second gun base is inserted with the charging gun, a switch to be turned on to inform the two charging guns that the two charging guns are respectively connected.

In practical application, the gun base controller may control connection and disconnection of a resistor with a resistance of 1K between CC1 and PE of a gun base. That is, in a case that only one gun base is inserted with a charging gun, the charging pile will not detect a connection state, avoiding a potential safety hazard caused by an output due to a misoperation. The gun base controller may detect the resistance between CC2 and PE. In a case that each of the two gun bases is inserted with a charging gun, the gun base controller controls a switch, for the resistors connected in series between CC1s and PE, to be turned on, so that the two inserted charging guns detects that the charging guns are respectively connected, and then subsequent steps are performed.

In an embodiment, in the device, for the first gun base, an inner connection line of the auxiliary power port may be connected to a power terminal of the gun base controller to supply power to the gun seat controller, and the protection line port is connected to a grounding terminal of the gun base controller; and for the second gun base, an inner connection line of the auxiliary power port may be connected to the power terminal of the gun base controller to supply power to the gun seat controller, and the protection line port is connected to the grounding terminal of the gun base controller.

In practical application, the power supply of the gun base controller may be a lithium battery or other batteries. In the process of charging detection, the internal battery may be charged by the auxiliary power (such as an auxiliary power supply with 12V voltage) outputted by the charging gun. Apparently, the gun base controller may directly supplied by the auxiliary power outputted by the charging guns. The above solutions are all within the protection scope of the present disclosure.

Figure 2:
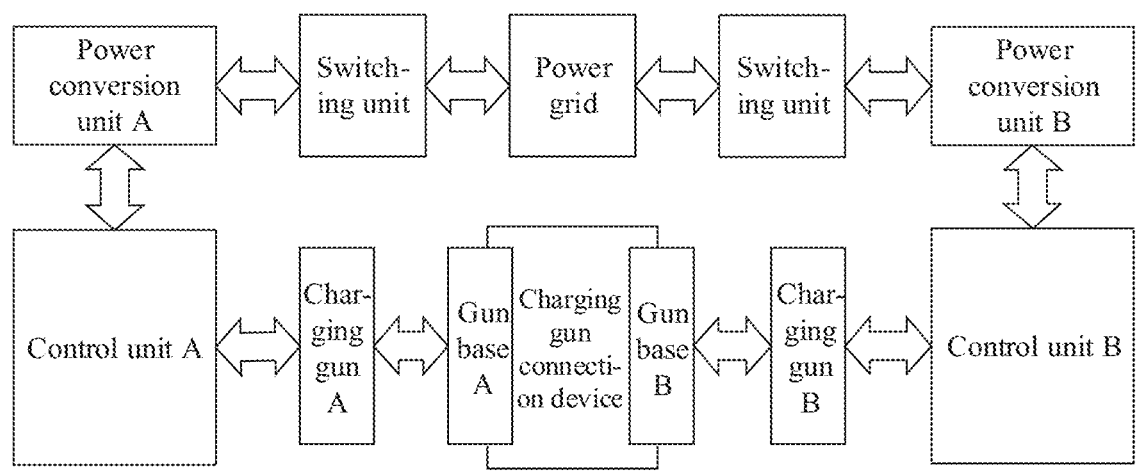
FIGS. 2 to 4 are schematic structural diagrams of a system for testing a charging pile according to three embodiments of the present disclosure.
Figure 3:
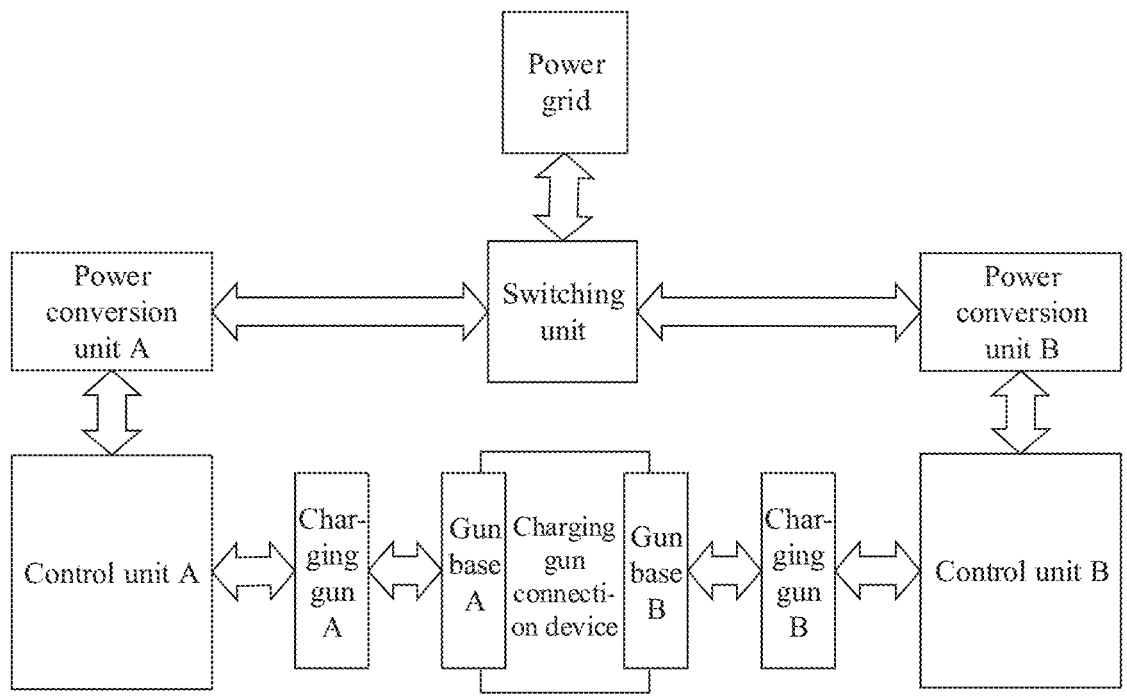
Figure 4:
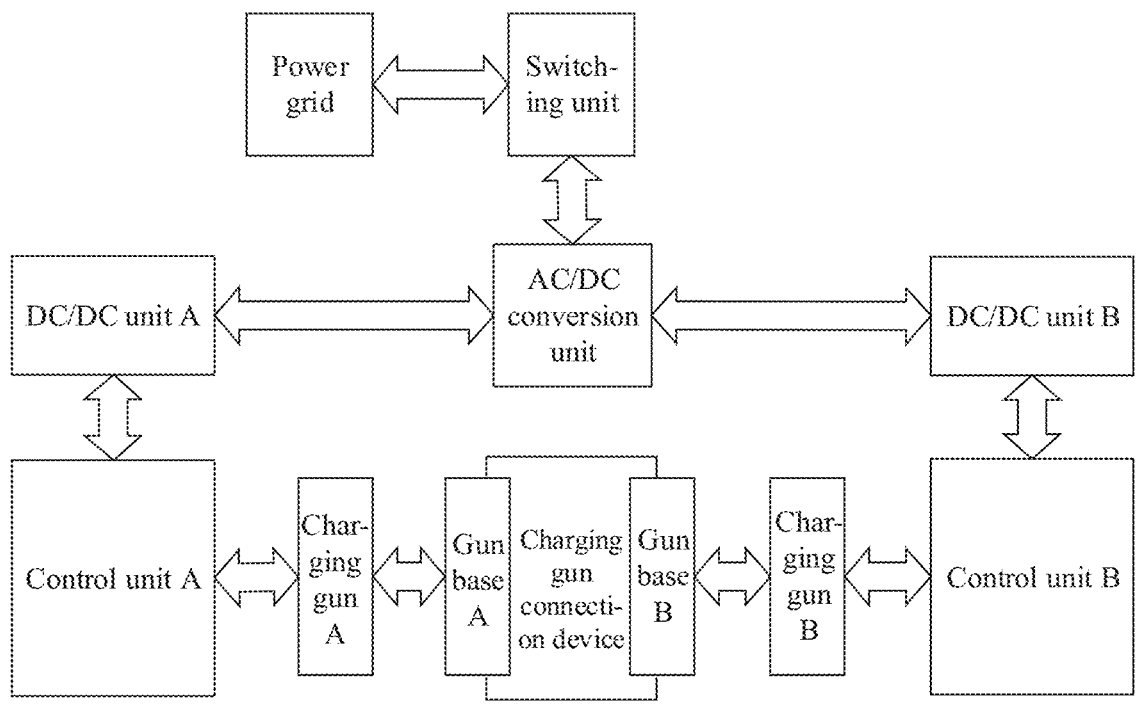

A charging pile is further provided according to another embodiment of the present disclosure. As shown in FIGS. 2, 3 and 4, the charging pile includes: one or more charging branches 200. Each of the charging branches 200 includes: a power conversion unit (such as the power conversion unit A and power conversion unit B shown in FIGS. 2 and 3, and the DC/DC unit A and DC/DC unit B shown in FIG. 4), a control unit (such as the control unit A and control unit B shown in FIG. 2 to FIG. 4), and a charging gun (such as the charging gun A and charging gun B shown in FIG. 2 to FIG. 4).

A first terminal of the power conversion unit is connected to a power grid via a device. A second terminal of the power conversion unit is connected to an inner side of the charging gun via the control unit. An outer side of the charging gun is connected to the device for testing a charging pile (such as the charging gun connection device shown in FIG. 2 to FIG. 4) according to the above embodiments.

The charging pile may include only one charging branch 200, and the charging gun of the charging pile is connected to a charging gun of another charging pile via the device for testing a charging pile. Alternatively, the charging pile may include multiple charging branches 200, and it is required that at least one of the multiple charging branches 200 is a bidirectional transmission branch. The power conversion unit in the bidirectional transmission branch has a function of bidirectional power conversion, and an operation state of the power conversion unit includes a forward output state and a reverse conversion state.

In practical application, in a case that the charging pile includes multiple charging branches 200, each of the multiple charging branches 200 may be a bidirectional transmission branch, or at least one of the multiple charging branches 200 is a unidirectional transmission branch. The power conversion unit in the unidirectional transmission branch does not have the function of bidirectional power conversion, and the operation state of the power conversion unit only includes a forward output state.

The control unit is configured to, in a case that the power conversion unit operates in the forward output state, control the charging gun to provide a charging function and serve as a tested gun. Alternatively, for the bidirectional transmission branch, the control unit is further configured to, in a case that the power conversion unit operates in the reverse conversion state, control the charging gun to provide a function of transmitting a communication message and serve as a testing gun.

In practical application, the communication message may be a simulated vehicle end BMS message. Thus, the charging gun in the bidirectional transmission branch supports a BMS simulation system, that is, the charging pile may be configured to operate in or automatically switches to a charging mode or a BMS simulation mode, so that the charging pile may have the function of the BMS simulation system to supports voltage simulation and power output. Specifically, the simulated vehicle end BMS message meets a predetermined standard such as a national standard BMS communication protocol GB/T27930 and a protocol conformance GB/T34658.

With the charging pile according to the embodiments of the present disclosure, a charging gun is tested by using the testing device according to the above embodiments based on the bidirectional energy flow in the bidirectional transmission branch of the charging pile, without the external device in the conventional technology, improving the convenience of the testing operation, and reducing the energy loss in testing the charging pile.

In practical application, the charging pile further includes a switching unit connected to the power grid. As shown in FIG. 2 to FIG. 4, the switching unit may be arranged between the charging branches 200 and the power grid in the following manners.

In manner (1), as shown in FIG. 2, in a case that a charging pile includes one charging gun, each of the charging branches 200 is connected to the power grid via one switching unit.

In manner (2), as shown in FIG. 3, in a case that a charging pile includes al least two charging guns, each of the charging branches 200 is connected to the power grid via the same one switching unit.

In manner (3), as shown in FIG. 4, in a case that a charging pile includes at least two charging guns, each of the charging branches 200 is connected to the power grid via the same one AC/DC conversion unit and the same one switching unit.

In the manners (1) and (2), the power conversion unit includes: an AC/DC conversion unit and a DC/DC unit. An alternating current side of the AC/DC conversion unit serves as the first terminal of the power conversion unit and is connected to the power grid via the switching unit. A direct current side of the AC/DC conversion unit is connected to the control unit via the DC/DC unit. That is, inverse conversion is performed by the power conversion unit on the direct current charging electric energy received by the testing gun, and then the electric energy after inverse conversion is ted back to the power grid.

In the manner (3), for each of the charging branches, the power conversion unit is a DC/DC unit, and the first terminal of the power conversion unit is connected to a direct current side of an AC/DC conversion unit via a direct current bus, and an alternating current side of the AC/DC conversion unit is connected to the power grid via the switching unit. In this manner, a common direct current bus is used. Inverse conversion is performed by the power conversion unit on the direct current charging electric energy received by the testing gun, and then the electric energy after inverse conversion is directly ted back to the direct current bus without passing through the power grid, reducing two-stage loss, thereby further reducing the loss of the system.

In practical application, in all the above manners, for the charging module performing power conversion, a previous-stage AC/DC conversion unit with a bidirectional power topology structure supports bidirectional energy flow, taking power from the power grid and transmission of active and reactive power to the power grid, and a next-stage DC/DC unit with a bidirectional DC/DC structure supports bidirectional energy flow. In addition, a sum of rated powers of all DC/DC units is greater than a sum of rated powers of all AC/DC conversion units. Therefore, in the charging pile, in a case that a previous-stage unit has a high-power bidirectional power topology structure, a redundant design of the system is realized, that is, a total power of the next-stage DC/DC is greater than an output power of the previous-stage PFC. In a case that output power of a single power group does not reach a rated output, the redundant DC/DC module distributes power to other power groups, thereby improving the efficiency of the device.

A system for testing a charging pile is further provided according to another embodiment of the present disclosure. As shown in FIG. 2 to FIG. 4, the system includes two charging branches 200 and one device for testing a charging pile (the charging gun connection device as shown in FIG. 2 to FIG. 4) according to the above embodiments. For the internal structure and operation principles of the device, one may refer to the above embodiments, which are not repeated herein.

One of the two charging branches 200 includes a charging gun serving as a tested gun, and the other one of the two charging branches 200 includes a charging gun serving as a testing gun. The charging branch 200 including the testing gun is a bidirectional transmission branch in the charging pile according to the above embodiments. For the internal structure and operation principles of the bidirectional transmission branch, one may refer to the above embodiments, which are not repeated herein.

In practical application, the charging branch 200 including the tested gun may be the bidirectional transmission branch in the charging pile according to the above embodiments.

In the system, the tested gun and the testing gun maybe included in one charging pile or different charging piles. Different cases are described in detail below.

In case (1), a solution for performing on-site detection on a charging pile is provided as shown in FIG. 2. In this solution, mutual detection is performed between two different charging piles. Each of the power conversion unit A and the power conversion unit B has the function of bidirectional power conversion. That is, each of the power conversion unit A and the power conversion unit B may convert an alternating current of the power grid to an adjustable direct current, and may perform reverse conversion on the direct current and then feedback the processed current to the power grid. The control unit A and the control unit B are control units of the charging piles. Each of the control units has the functions of testing a charging gun, charging an electric vehicle, and providing a simulated vehicle end BMS message. The simulated BMS battery information meets standards, such as the national standard BMS communication protocol GB/T27930 and the protocol conformance GB/T34658. The control unit of the tested gun may not have the function of simulating a BMS message.

In case (2), another solution for performing on-site detection on a charging pile is provided as shown in FIG. 3. In this solution, mutual detection is performed on two charging gun of one charging pile. The functions of the units are the same as the functions of the units in case (1), and are not repeated herein.

In case (3), another solution for performing on-site detection on a charging pile is provided as shown in FIG. 4. In this solution, detection is performed on charging piles with a common direct current bus. The AC/DC conversion unit converts the alternating current of the power grid to a stable direct current, or performs reverse conversion on the direct current and then feeds back the processed current to the power grid. Each of the DC/DC unit A and the DC/DC unit B converts the stable direct current to a direct current required by the electric vehicle, and transmit the electricity of the electric vehicle to the direct current bus. The AC/DC conversion unit and the DC/DC units support bidirectional energy flow.

With the system for testing a charging pile, testing is performed without the external device in the conventional technology, improving the convenience of the testing operation. In addition, the testing gun performs reverse conversion on the direct current charging electric energy received by the testing gun, and then the electric energy is fed back to the energy source of the charging gun, reducing the energy loss in testing according to the conventional technology.

Figure 5:
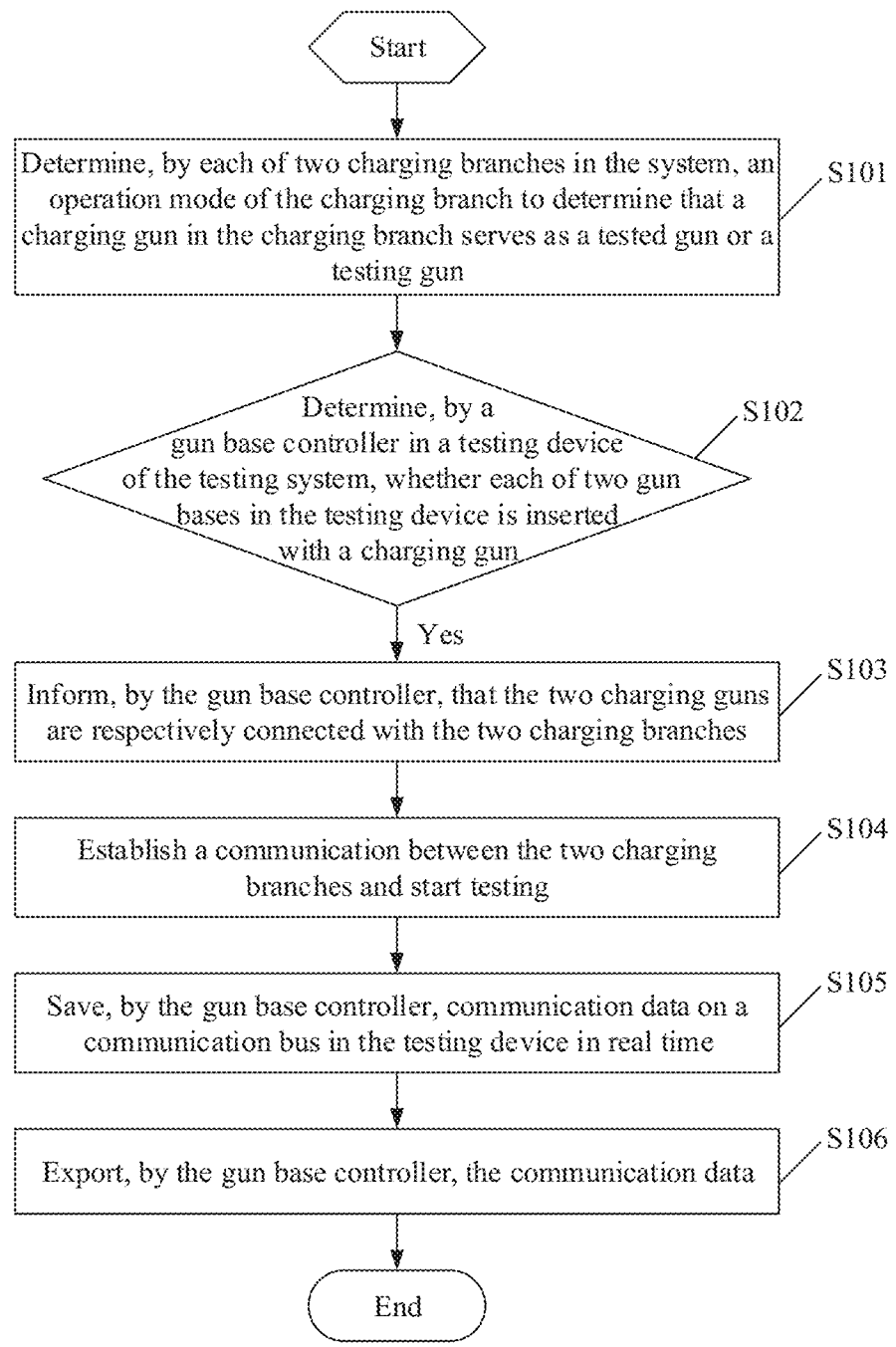
FIG. 5 is a flowchart of a method for testing a charging pile according to an embodiment of the present disclosure.

A method for testing a charging pile is further provided according to another embodiment of the present disclosure. The method is applied to the system for testing a charging pile according to the above embodiments. As shown in FIG. 5, the method includes the following steps S101 to S106.

In step S101, each of charging branches in the testing system determines an operation mode of the charging branch to determine that a charging gun in the charging branch serves as a tested gun or a testing gun.

The step S101 further includes the following sub steps (1) and (2).

In sub step (1), one of the charging branches determines that it is required to control a power conversion unit in the charging branch to operate in a forward output state based on operation mode setting information received by the charging branch, so that a charging gun in the charging branch provides a charging function and serves as the tested gun.

In sub step (2), the other one of the charging branches determines that it is required to control a power conversion unit in the charging branch to operate in a reverse conversion state based on the operation mode setting information received by the charging branch, so that a charging gun in the charging branch provides a function of transmitting a simulated vehicle end BMS message and serves as the testing gun.

In step S102, a gun base controller in a testing device of the testing system determines whether each of two charging gun bases in the testing device is inserted with a charging gun.

In a case that each of the two charging gun bases in the testing device is inserted with a charging gun, proceed to step S103.

In step S103, the gun base controller informs the two charging guns that the two charging guns are respectively connected with the two charging branches.

In step S104, a communication is established between the two charging branches and testing is started.

Figure 6:
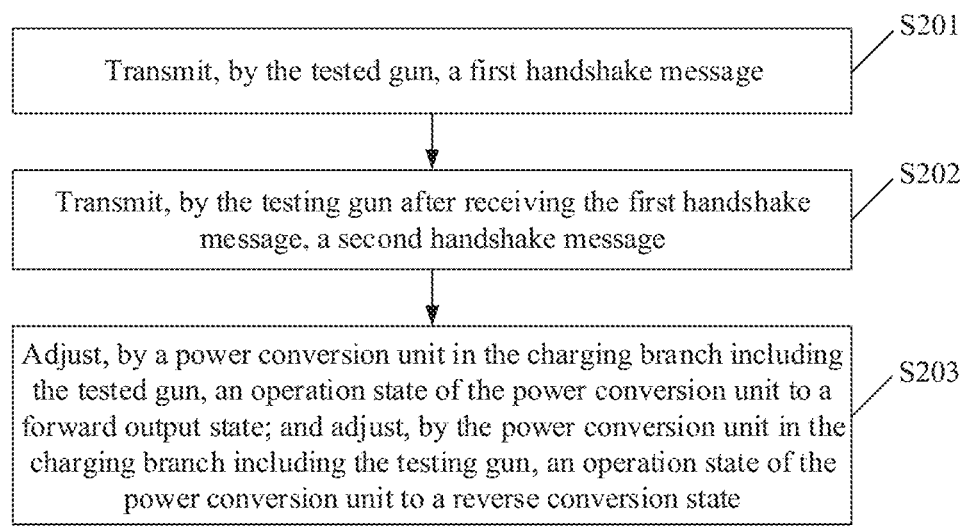
FIG. 6 is a flowchart of a part of a method for testing a charging pile according to an embodiment of the present disclosure.

The step S104 includes the following sub steps S201 to S203 as shown in FIG. 6.

In sub step S201, the tested gun transmits a first handshake message.

In sub step S202, after receiving the first handshake message, the testing gun transmits a second handshake message.

In sub step S203, a power conversion unit in the charging branch including the tested gun adjusts an operation state of the power conversion unit to a forward output state, and the power conversion unit in the charging branch including the testing gun adjusts an operation state of the power conversion unit to a reverse conversion state.

After step S104 is performed, proceed to step S105.

In step S105, the gun base controller saves communication data on a communication bus in the testing device in real time.

Step S106 may further be performed after step S105 is completed.

In step S106, the gun base controller exports the communication data.

Figure 7:
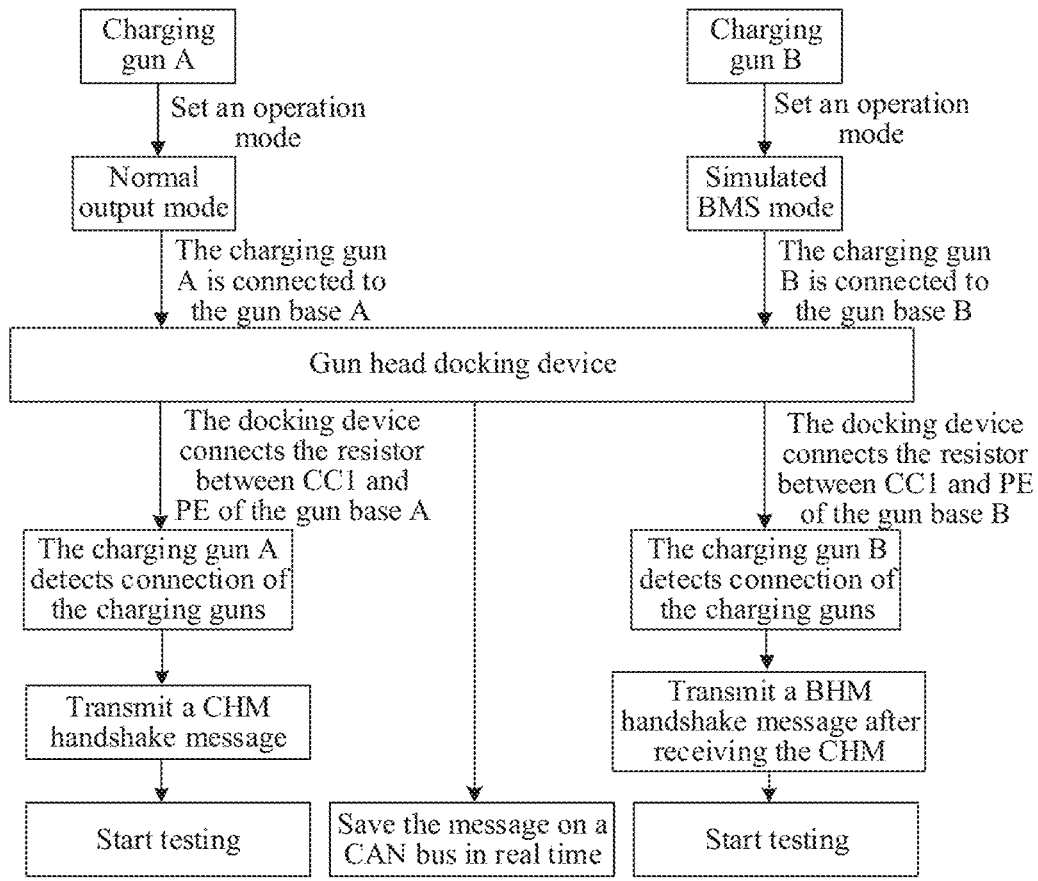
FIG. 7 is a flowchart of a method for testing a charging pile according to an embodiment of the present disclosure.

For any two charging guns, FIG. 7 shows an operation process of a testing system having an on-site testing function. In FIG. 7, charging gun A serves as a tested gun, and a charging process is tested; and charging gun B serves as a testing gun, transmits BMS simulation data and analyzes the data in real time based on the state of the charging gun A. The operation process is described as following.

(1) The charging gun A is configured to operate in a normal output mode, the charging gun B is configured to operate in a simulated BMS mode, and testing items is predetermined.

(2) The charging gun A and the charging gun B are respectively inserted into two gun bases of a gun head docking device (that is, the device for testing a charging pile according to the above embodiments). The order in which the charging guns are inserted into the gun bases is not limited.

(3) After the gun head docking device detects that the charging gun A and the charging gun B are inserted, the gun base controller of the gun head docking device controls a resistor between CC1 and PE of one of the gun bases and a resistor between CC1 and PE of the other of the gun bases to be connected. Then, the charging gun A and charging gun B detect that the guns are connected and testing may be started.

(4) The charging gun A transmits a first handshake message, that is, a handshake message CHM. After receiving the CHM, the charging gun B transmits a second handshake message, that is, a handshake message BHM.

(5) The testing is started.

(6) The gun base controller saves a message on a CAN bus in real time for export and analysis.

The embodiments of the present disclosure are described in a progressive manner, each embodiment focuses on differences from other embodiments, and the same or similar parts between the various embodiments may be referred to each other. For the system disclosed in the embodiments, since the principle is the same as the method disclosed in the embodiments, the description is relatively simple, and the relevant parts can be referred to the method part. The system and system embodiment described in the above are merely illustrative. Units described as separate components may be or may not be physically separated. Components shown as units may be or may not be physical units, that is, may be located in one location or may be distributed in multiple network units. Parts or all of the modules may be selected based on actual conditions, to implement the technical solutions of the present disclosure. Those skilled in the art can understand and implement the present disclosure without any creative effort.

It should be appreciated by those skilled in the art that, the exemplary units and algorithm steps in the embodiments described herein can be implemented as electronic hardware, a computer software, or a combination of computer software and the electronic hardware. In order to clearly illustrate the interchangeability of hardware and software, the composition and steps of each example have been described generally in terms of functions in the above description. Whether the functions being implemented in a hardware form or in a software form depends on a particular application of technical solutions and a design constraint. Skilled artisans may implement the described functions in varying ways for a particular application, but such implementation should not be interpreted as causing a departure from the scope of the present disclosure.

Features described in the embodiments of the present disclosure may be replaced or combined with each other. The above illustration of the disclosed embodiments enables those skilled in the art to implement or practice the present disclosure. Many changes to these embodiments are apparent for those skilled in the art, and general principles defined herein can be implemented in other embodiments without departing the spirit or scope of the present disclosure. Therefore, the present disclosure is not limited to the embodiments disclosed herein, but is to conform to the widest scope consistent with principles and novel features disclosed herein.

The invention claimed is:

1. A device for testing a charging pile, comprising a first gun base, a second gun base and a gun base controller, wherein each of the first gun base and the second gun base is provided with a power port and a communication port;

an inner side of the power port of the first gun base is connected to an inner side of the power port of the second gun base, and an inner side of the communication port of the first gun base is connected to an inner side of the communication port of the second gun base;

an outer side of the power port of the first gun base is connected to a corresponding port of a charging gun connected to the first gun base, and an outer side of the communication port of the first gun base is connected to a corresponding port of the charging gun connected to the first gun base;

an outer side of the power port of the second gun base is connected to a corresponding port of a charging gun connected to the second gun base, and an outer side of the communication port of the second gun base is connected to a corresponding port of the charging gun connected to the second gun base;

one of the charging gun connected to the first gun base and the charging gun connected to the second gun base serves as a tested gun operating in a forward output state, and the other one of the charging gun connected to the first gun base and the charging gun connected to the second gun base serves as a testing gun operating in a reverse conversion state;

an inner connection line of the communication port of the first gun base is connected to an inner communication terminal of the gun base controller via a communication bus, and an inner connection line of the communication port of the second gun base is connected to an inner communication terminal of the gun base controller via the communication bus; and the gun base controller is configured to save communication data on the communication bus and export the communication data via an outer communication terminal of the gun base controller.

2. The device for testing a charging pile according to claim 1, wherein the power port comprises a charging power port and an auxiliary power port;

each of the first gun base and the second gun base is provided with a protection line port;

an inner side of the charging power port of the first gun base is connected to an inner side of the charging power port of the second gun base, and an outer side of the charging power port of the first gun base is connected to a corresponding port of the charging gun connected to the first gun base;

an inner side of the auxiliary power port of the first gun base is connected to an inner side of the auxiliary power port of the second gun base, and an outer side of the auxiliary power port of the first gun base is connected to a corresponding port of the charging gun connected to the first gun base; and an inner side of the protection line port of the first gun base is connected to an inner side of the protection line port of the second gun base, and an outer side of the protection line port of the first gun base is connected to a corresponding port of the charging gun connected to the first gun base.

3. The device for testing a charging pile according to claim 2, wherein
each of the first gun base and the second gun base is further provided with a first connection confirmation port and a second connection confirmation port;
for the first gun base,
an inner side of the first connection confirmation port is connected to an inner connection line of the protection line port via a resistor and a switch in the gun base controller, an outer side of the first connection confirmation port is connected to a corresponding port of the charging gun connected to the first gun base, and an outer side of the second connection confirmation port is connected to a corresponding port of the charging gun connected to the first gun base;
for the second gun base,
an inner side of the first connection confirmation port is connected to the inner connection line of the protection line port via a resistor and a switch in the gun base controller, an outer side of the first connection confirmation port is connected to a corresponding port of the charging gun connected to the second gun base, and an outer side of the second connection confirmation port is connected to a corresponding port of the charging gun connected to the second gun base; and
the gun base controller is further configured to:
determine whether the first gun base is inserted with the charging gun by detecting a resistance between the second connection confirmation port and the protection line port of the first gun base;
determine whether the second gun base is inserted with the charging gun by detecting a resistance between the second connection confirmation port and the protection line port of the second gun base; and
in a case that the first gun base is inserted with the charging gun and the second gun base is inserted with the charging gun, control a switch to be turned on to inform the two charging guns that the two charging guns are respectively connected.

4. The device for testing a charging pile according to claim 2, wherein
for the first gun base, an inner connection line of the auxiliary power port is connected to a power terminal of the gun base controller to supply power to the gun base controller; and the protection line port is connected to a grounding terminal of the gun base controller; and
for the second gun base, an inner connection line of the auxiliary power port is connected to the power terminal of the gun base controller to supply power to the gun base controller; and the protection line port is connected to the grounding terminal of the gun base controller.

5. The device for testing a charging pile according to claim 1, wherein the communication data is a CAN message transmitted between the tested gun and the testing gun.

6. A charging pile, wherein the charging pile comprises one or more charging branches, and each of the charging branches comprises a power conversion unit, a control unit and a charging gun, wherein
a first terminal of the power conversion unit is connected to a power grid via a device;
a second terminal of the power conversion unit is connected to an inner side of the charging gun via the control unit;
an outer side of the charging gun is connected to the device for testing a charging pile according to claim 1;
at least one of the charging branches is a bidirectional transmission branch, the power conversion unit in the charging branch has a function of bidirectional power conversion, and an operation state of the power conversion unit comprises a forward output state and a reverse conversion state; and
the control unit is configured to:
in a case that the power conversion unit operates in the forward output state, control the charging gun to provide a charging function and serve as a tested gun; and
in a case that the power conversion unit operates in the reverse conversion state, control the charging gun to provide a function of transmitting a communication message and serve as a testing gun.

7. The charging pile according to claim 6, further comprising a switching unit arranged between the charging branches and the power grid.

8. The charging pile according to claim 7, wherein
the power conversion unit comprises an AC/DC conversion unit and a DC/DC unit;
an alternating current side of the AC/DC conversion unit serves as the first terminal of the power conversion unit and is connected to the power grid via the switching unit;
and a direct current side of the AC/DC conversion unit is connected to the control unit via the DC/DC unit.

9. The charging pile according to claim 8, wherein in a case that the charging pile comprises a plurality of charging branches, the plurality of charging branches share the same switching unit.

10. The charging pile according to claim 8, wherein a sum of rated powers of all DC/DC units is greater than a sum of rated powers of all AC/DC conversion units.

11. The charging pile according to claim 7, wherein
in a case that the charging pile comprises a plurality of charging branches,
the charging pile further comprises AC/DC conversion units,
for each of the plurality of charging branches, the power conversion unit in the charging branch is a DC/DC unit, and the first terminal of the power conversion unit is connected to a direct current side of one of the AC/DC conversion units via a direct current bus, and
an alternating current side of the AC/DC conversion unit is connected to the power grid via the switching unit.

12. The charging pile according to claim 11, wherein a sum of rated powers of all DC/DC units is greater than a sum of rated powers of all AC/DC conversion units.

13. The charging pile according to claim 6, wherein the communication message comprises a simulated vehicle end BMS message, and the simulated vehicle end BMS message meets a predetermined standard.

14. The charging pile according to claim 6, wherein
in the case that the charging pile comprises the plurality of charging branches, at least one of the charging branches is a unidirectional transmission branch, the power conversion unit in the charging branch does not have the function of bidirectional power conversion, and the operation state of the power conversion unit only comprises the forward output state.

15. A system for testing a charging pile, comprising two charging branches and one device for testing a charging pile comprising a first gun base, a second gun base and a gun base controller, wherein
each of the first gun base and the second gun base is provided with a power port and a communication port;

an inner side of the power port of the first gun base is connected to an inner side of the power port of the second gun base, and an inner side of the communication port of the first gun base is connected to an inner side of the communication port of the second gun base;

an outer side of the power port of the first gun base is connected to a corresponding port of a charging gun connected to the first gun base, and an outer side of the communication port of the first gun base is connected to a corresponding port of the charging gun connected to the first gun base;

an outer side of the power port of the second gun base is connected to a corresponding port of a charging gun connected to the second gun base, and an outer side of the communication port of the second gun base is connected to a corresponding port of the charging gun connected to the second gun base;

one of the charging gun connected to the first gun base and the charging gun connected to the second gun base serves as a tested gun operating in a forward output state, and the other one of the charging gun connected to the first gun base and the charging gun connected to the second gun base serves as a testing gun operating in a reverse conversion state;

an inner connection line of the communication port of the first gun base is connected to an inner communication terminal of the gun base controller via a communication bus, and an inner connection line of the communication port of the second gun base is connected to an inner communication terminal of the gun base controller via the communication bus; and the gun base controller is configured to save communication data on the communication bus and export the communication data via an outer communication terminal of the gun base controller; wherein one of the two charging branches comprises a charging gun serving as a tested gun, and the other one of the two charging branches comprises a charging gun serving as a testing gun; and the charging branch comprising the testing gun is a bidirectional transmission branch in the charging pile according to claim 6.

16. A method for testing a charging pile, applied to the system for a testing charging pile according to claim 15, wherein the method comprises:

determining, by each of two charging branches in the system, an operation mode of the charging branch to determine that a charging gun in the charging branch serves as a tested gun or a testing gun;

determining, by a gun base controller in a testing device of the testing system, whether each of two gun bases in the testing device is inserted with a charging gun;

informing, by the gun base controller in a case that each of the two gun bases in the testing device is inserted with the charging gun, the two charging guns that the two charging guns are respectively connected with the two charging branches;

establishing a communication between the two charging branches, and starting testing; and saving, by the gun base controller, communication data on a communication bus in the testing device in real time.

17. The method for testing a charging pile according to claim 16, wherein the determining, by each of two charging branches in the system, an operation mode of the charging branch to determine that a charging gun in the charging branch serves as a tested gun or a testing gun comprises:

determining, by one of the charging branches based on operation mode setting information received by the charging branch, that it is required to control a power conversion unit in the charging branch to operate in a forward output state, wherein a charging gun in the charging branch provides a charging function and serves as the tested gun; and determining, by the other one of the charging branches based on the operation mode setting information received by the charging branch, that it is required to control a power conversion unit in the charging branch to operate in a reverse conversion state, wherein a charging gun in the charging branch provides a function of transmitting a simulated vehicle end BMS message and serves as the testing gun.

18. The method for testing a charging pile according to claim 16, wherein the establishing communication between the two charging branches and starting testing comprises:

transmitting, by the tested gun, a first handshake message;

transmitting, by the testing gun after receiving the first handshake message, a second handshake message;

adjusting, by a power conversion unit in the charging branch comprising the tested gun, an operation state of the power conversion unit to a forward output state; and adjusting, by the power conversion unit in the charging branch comprising the testing gun, an operation state of the power conversion unit to a reverse conversion state.

19. The method for testing a charging pile according to claim 16, wherein after the saving, by the gun base controller, communication data on a communication bus in the testing device in real time, the method further comprises:

exporting, by the gun base controller, the communication data.

20. A system for testing a charging pile comprising two charging branches and one device for testing a charging pile, comprising a first gun base, a second gun base and a gun base controller, wherein each of the first gun base and the second gun base is provided with a power port and a communication port;

an inner side of the power port of the first gun base is connected to an inner side of the power port of the second gun base, and an inner side of the communication port of the first gun base is connected to an inner side of the communication port of the second gun base;

an outer side of the power port of the first gun base is connected to a corresponding port of a charging gun connected to the first gun base, and an outer side of the communication port of the first gun base is connected to a corresponding port of the charging gun connected to the first gun base;

an outer side of the power port of the second gun base is connected to a corresponding port of a charging gun connected to the second gun base, and an outer side of the communication port of the second gun base is connected to a corresponding port of the charging gun connected to the second gun base;

one of the charging gun connected to the first gun base and the charging gun connected to the second gun base serves as a tested gun operating in a forward output state, and the other one of the charging gun connected to the first gun base and the charging gun connected to the second gun base serves as a testing gun operating in a reverse conversion state;

an inner connection line of the communication port of the first gun base is connected to an inner communication terminal of the gun base controller via a communication bus, and an inner connection line of the communication port of the second gun base is connected to an inner communication terminal of the gun base controller via the communication bus; and the gun base controller is configured to save communication data on the communication bus and export the communication data via an outer communication terminal of the gun base controller, one of the two charging branches comprises a charging gun serving as a tested gun, and the other one of the two charging branches comprises a charging gun serving as a testing gun;

wherein the charging branch comprising the tested gun is a bidirectional transmission branch in the charging pile according to claim 6.

\* \* \* \* \*